(12) United States Patent
Kitami (10) Patent No.: US 10,418,963 B2
(45) Date of Patent: Sep. 17, 2019

(54) MULTILAYER FILTER

(71) Applicant: TDK CORPORATION, Tokyo (JP)

(72) Inventor: Manabu Kitami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 50 days.

(21) Appl. No.: 15/801,744

(22) Filed: Nov. 2, 2017

(65) Prior Publication Data

US 2018/0145651 A1    May 24, 2018

(30) Foreign Application Priority Data

Nov. 9, 2016  (JP) ................ 2016-219048

(51) Int. Cl.
*H03H 7/01* (2006.01)
*H03H 1/00* (2006.01)

(52) U.S. Cl.
CPC ........... *H03H 7/0115* (2013.01); *H03H 1/00* (2013.01); *H03H 7/1708* (2013.01); *H03H 7/1766* (2013.01); *H03H 7/1783* (2013.01); *H03H 7/1791* (2013.01); *H03H 2001/0085* (2013.01)

(58) Field of Classification Search
CPC ........... H03H 7/463; H03H 2001/0085; H03H 7/0115; H03H 7/1766; H03H 7/1708; H03H 7/1783; H03H 7/1791
USPC ................................. 333/175, 185
See application file for complete search history.

(56) References Cited

U.S. PATENT DOCUMENTS 6,411,178 B1 * 6/2002 Matsumura .......... H03H 7/0115
                                                          333/134
2009/0189714 A1    7/2009 Sakisaka et al.

FOREIGN PATENT DOCUMENTS

JP         2009-182377 A     8/2009

* cited by examiner

*Primary Examiner* — Rakesh B Patel
(74) *Attorney, Agent, or Firm* — Oliff PLC

(57) ABSTRACT

A multilayer filter includes an element body formed by stacking a plurality of insulator layers, and an input terminal, a first output terminal, and a ground terminal arranged on outer surfaces of the element body, a first LC resonance circuit provided in a line connecting the input terminal to the first output terminal and including a first inductor and a first capacitor, and an open inductor having one end connected to the ground terminal and the other end open are provided in the element body, and the open inductor is arranged to face the first output terminal or the first inductor.

7 Claims, 6 Drawing Sheets

MULTILAYER FILTER

TECHNICAL FIELD

The present invention relates to a multilayer filter.

BACKGROUND

As a multilayer filter of the related art, for example, a multilayer filter described in Patent Document 1 (Japanese Unexamined Patent Publication No. 2009-182377) is known. The multilayer filter described in Patent Document 1 includes a first inductor and a second inductor connected in series and provided between an input terminal and an output terminal, a first capacitor connected in parallel with the first inductor, a second capacitor connected in parallel to the second inductor, third to fifth capacitors, and third to fifth inductors. An output end and an input end of the first inductor are connected to a ground via the third capacitor and the third inductor connected in series. The input end of the first inductor is connected to the ground via the fourth capacitor and the fourth inductor connected in series. An output end of the second inductor is connected to the ground via the sixth capacitor and the sixth inductor connected in series.

SUMMARY

In the multilayer filter of the related art, by providing a plurality of LC resonance circuits each including an inductor and a capacitor, an increase in an attenuation area is achieved. However, when the plurality of LC resonance circuits are provided, a configuration becomes complicated and a size thereof increases. With a certain size of the multilayer filter, a space for providing the plurality of LC resonance circuits may not be ensured.

An object of an aspect of the present invention is to provide a multilayer filter capable of achieving expansion of an attenuation band while achieving a small size.

A multilayer filter according to an aspect of the present invention includes an element body formed by stacking a plurality of insulator layers; and an input terminal, a first output terminal, and a ground terminal arranged on outer surfaces of the element body, wherein a first LC resonance circuit provided in a line connecting the input terminal to the first output terminal and including a first inductor and a first capacitor, and an open inductor having one end connected to the ground terminal and the other end open are provided in the element body, and the open inductor is arranged to face the first output terminal or the first inductor.

In the multilayer filter according to the aspect of the present invention, the open inductor having one end connected to the ground terminal and the other end open is provided in the element body. The open inductor is arranged to face the first output terminal or the first inductor. Accordingly, a capacitor is formed between the open inductor and the first output terminal or the inductor. Further, the open inductor itself has a stray capacitance. Accordingly, in the multilayer filter, the same circuit as the LC circuit connected in parallel to the line connecting the input terminal to the first output terminal is formed. Therefore, in the multilayer filter, it is possible to obtain attenuation characteristics that are the same as those when a plurality of LC resonance circuits are provided even when a plurality of LC resonators are not provided. Accordingly, in the multilayer filter, it is possible to achieve expansion of the attenuation characteristics while achieving a small size.

In the embodiment, the open inductor and the first inductor may be adjacent to each other in a direction in which the plurality of insulator layers are stacked. In this configuration, a capacitor can be formed between the open inductor and the first inductor.

In the embodiment, each of the first inductor and the open inductor may be formed in a loop shape centered on a direction that follows the direction in which the plurality of insulator layers are stacked, which is an axial center, and a width on the inner side of the first inductor and a width on the inner side of the open inductor may be the same when viewed in a direction that follows the axial center. In this configuration, it is possible to suppress hindrance of a flux of the first inductor due to the open inductor. Therefore, since a reduction in a Q value can be suppressed, it is possible to suppress deterioration of characteristics.

In the embodiment, the first LC resonance circuit may selectively pass a first signal at a frequency within a first frequency band among the first signal and a second signal at a frequency within a second frequency band that is a frequency band higher than the first frequency band, and a second LC resonance circuit may be provided in the element body, the second LC resonance circuit being provided in the line connecting the input terminal to the first output terminal, including a second inductor and a second capacitor, and selectively passing the second signal. Thus, when a plurality of filters are configured, a configuration in which the open inductor is provided is particularly effective.

In the embodiment, a second output terminal arranged on the outer surface of the element body may be included, and a third LC resonance circuit may be provided in the element body, the third LC resonance circuit being provided in a line connecting the input terminal to the second output terminal and including a third inductor and a third capacitor. In this configuration, a diplexer can be configured. Thus, when a plurality of filters are configured, a configuration in which the open inductor is provided is particularly effective.

According to the aspect of the present invention, it is possible to achieve expansion of an attenuation band while achieving a small size.

DETAILED DESCRIPTION

Hereinafter, preferred embodiments of the present invention will be described in detail with reference to the accompanying drawings. In the description of the drawings, the same or corresponding elements are denoted with the same reference numerals, and repeated description is omitted.

Figure 1:
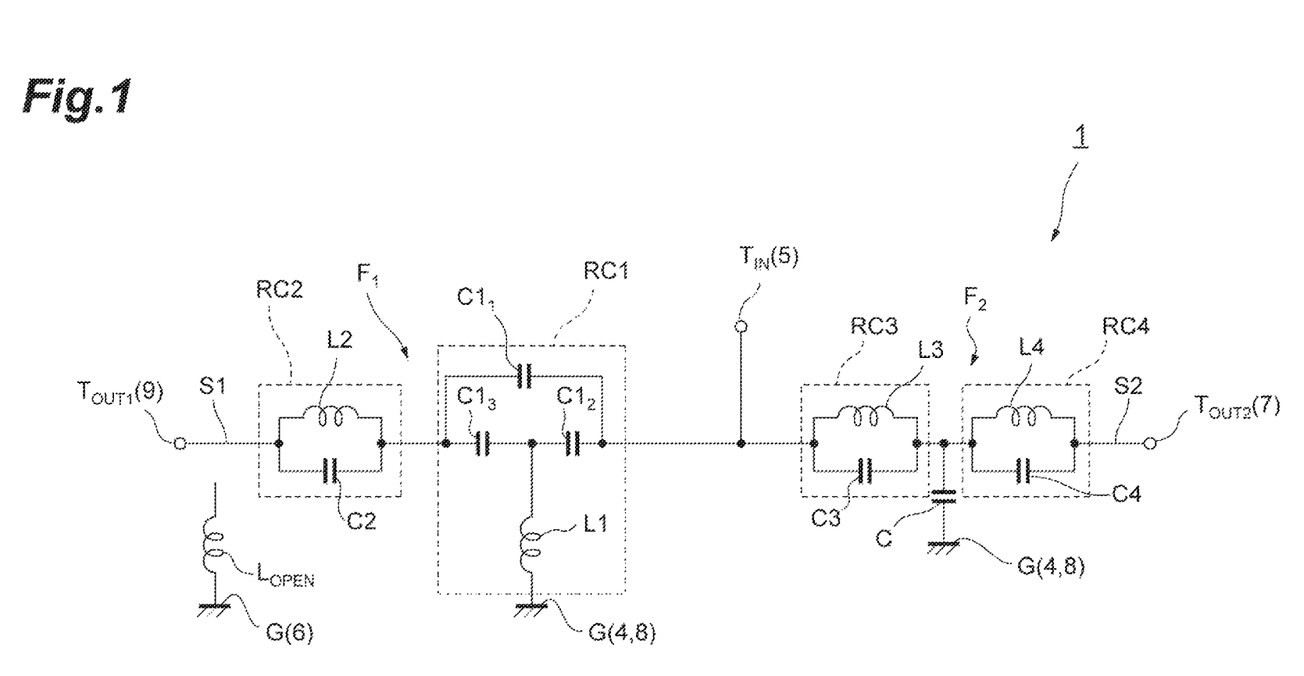
FIG. 1 is a diagram illustrating an equivalent circuit of a multilayer filter according to an embodiment.

A circuit configuration of the multilayer filter will be described in order to describe a structure of the multilayer filter according to an embodiment. As illustrated in FIG. 1, the multilayer filter 1 includes an input terminal $T_{IN}$ to which a signal is input, a first output terminal $T_{OUT1}$ from which a signal is output, a second output terminal $T_{OUT2}$ from which a signal is output, a first filter $F_1$ that is provided in a line S1 which connects the input terminal $T_{IN}$ to the first output terminal $T_{OUT1}$, a second filter $F_2$ that is provided in a line S2 that connects the input terminal $T_{IN}$ to the second output terminal $T_{OUT2}$, and an open inductor $L_{OPEN}$. The multilayer filter 1 is a diplexer.

The first filter $F_1$ includes a first LC resonance circuit (a second LC resonance circuit in the claims) RC1, a second LC resonance circuit (a first LC resonance circuit in the claims) RC2, and an open inductor $L_{OPEN}$. The first LC resonance circuit RC1 includes an inductor (a second inductor) L1, and three capacitors (second capacitors) C11, C12, and C13. The first LC resonance circuit RC1 constitutes a high pass filter. The first LC resonance circuit RC1 selectively passes a second signal among a first signal at a frequency within a first frequency band and the second signal at a frequency within a second frequency band that is a frequency band higher than the first frequency band.

The second LC resonance circuit RC2 includes an inductor (a first inductor) L2 and a capacitor (a first capacitor) C2 that are connected in parallel. The second LC resonance circuit RC2 constitutes a low pass filter. The second LC resonance circuit RC2 selectively passes the first signal among the first signal and the second signal.

The second filter $F_2$ includes a third LC resonance circuit RC3, a fourth LC resonance circuit RC4, and a capacitor C. The third LC resonance circuit RC3 and the fourth LC resonance circuit RC4 are connected in series. The third LC resonance circuit RC3 includes an inductor (a third inductor) L3 and a capacitor (a third capacitor) C3 that are connected in parallel. The fourth LC resonance circuit RC4 includes an inductor (a third inductor) L4 and a capacitor (third inductor) C4 that are connected in parallel. The third LC resonance circuit RC3 and the fourth LC resonance circuit RC4 constitute a low pass filter. The capacitor C includes one end connected between the third LC resonance circuit RC3 and the fourth LC resonance circuit RC4, and the other end connected to a ground terminal G.

The open inductor $L_{OPEN}$ includes one end connected to the ground terminal G, and the other end that is open.

Figure 2:
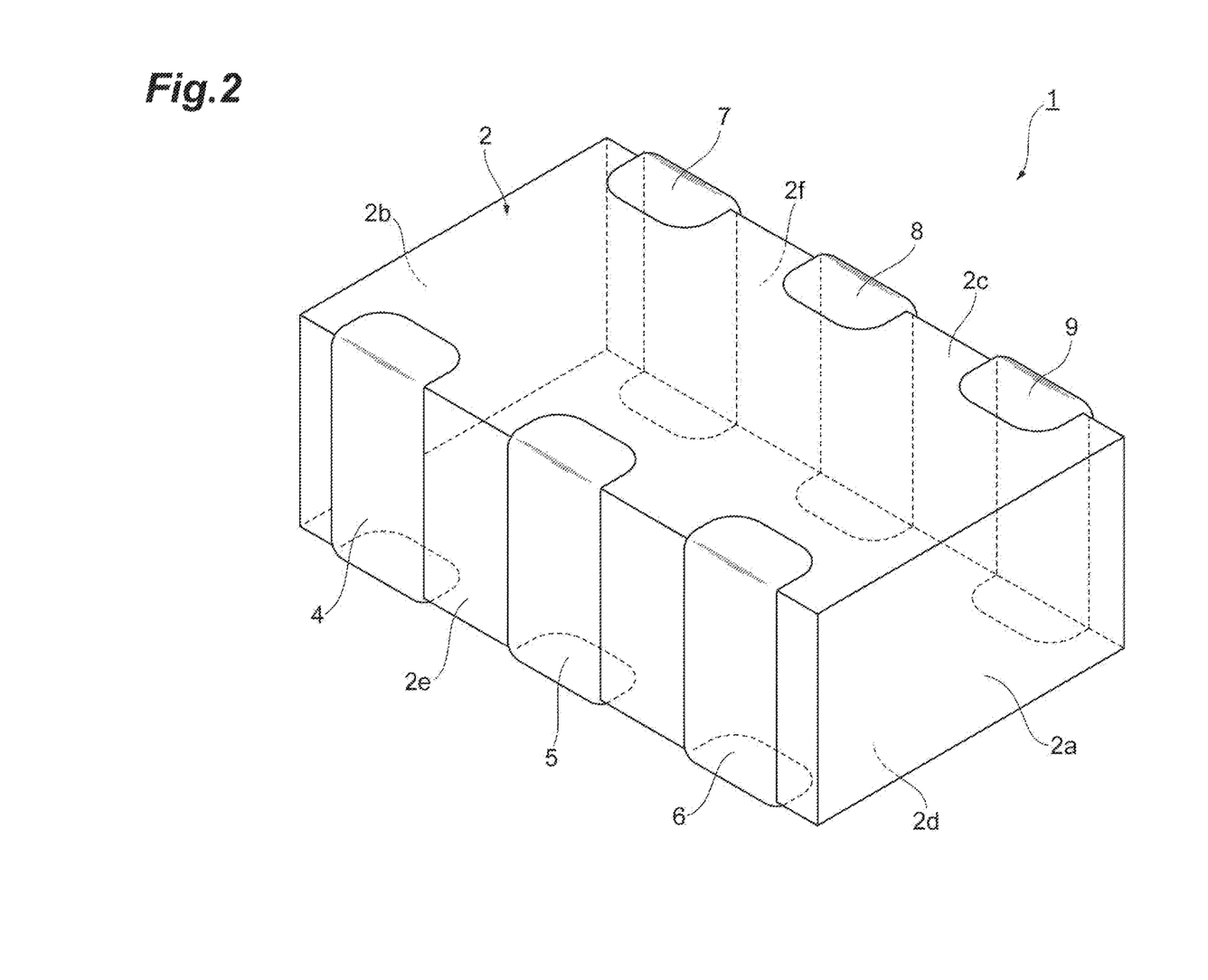
FIG. 2 is a perspective view illustrating the multilayer filter.

Next, a structure of the multilayer filter 1 will be described. As illustrated in FIG. 2, the multilayer filter 1 includes an element body 2, a first terminal electrode 4, a second terminal electrode 5, a third terminal electrode 6, a fourth terminal electrode 7, a fifth terminal electrode 8, and a sixth terminal electrode 9.

The element body 2 has a rectangular parallelepiped shape. The element body 2 includes, as outer surfaces, a pair of end surfaces 2a and 2b that face each other, a pair of main surfaces 2c and 2d that extend to connect between the pair of end surfaces 2a and 2b and face each other, and a pair of side surfaces 2e and 2f that extend to connect between the pair of main surfaces 2c and 2d and face each other. The main surface 2d is defined as, for example, a surface facing another electronic device when the multilayer filter 1 is mounted on the other electronic device (for example, a circuit board or an electronic component) that is not illustrated.

A direction in which the end surfaces 2a and 2b face each other, a direction in which the main surfaces 2c and 2d face each other, and a direction in which the side surfaces 2e and 2f face each other are substantially perpendicular to one another. The rectangular parallelepiped shape includes a rectangular parallelepiped shape in which corner portions and ridgeline portions are chamfered, and a rectangular parallelepiped shape in which corner portions and ridge line portions are rounded.

Figure 3:
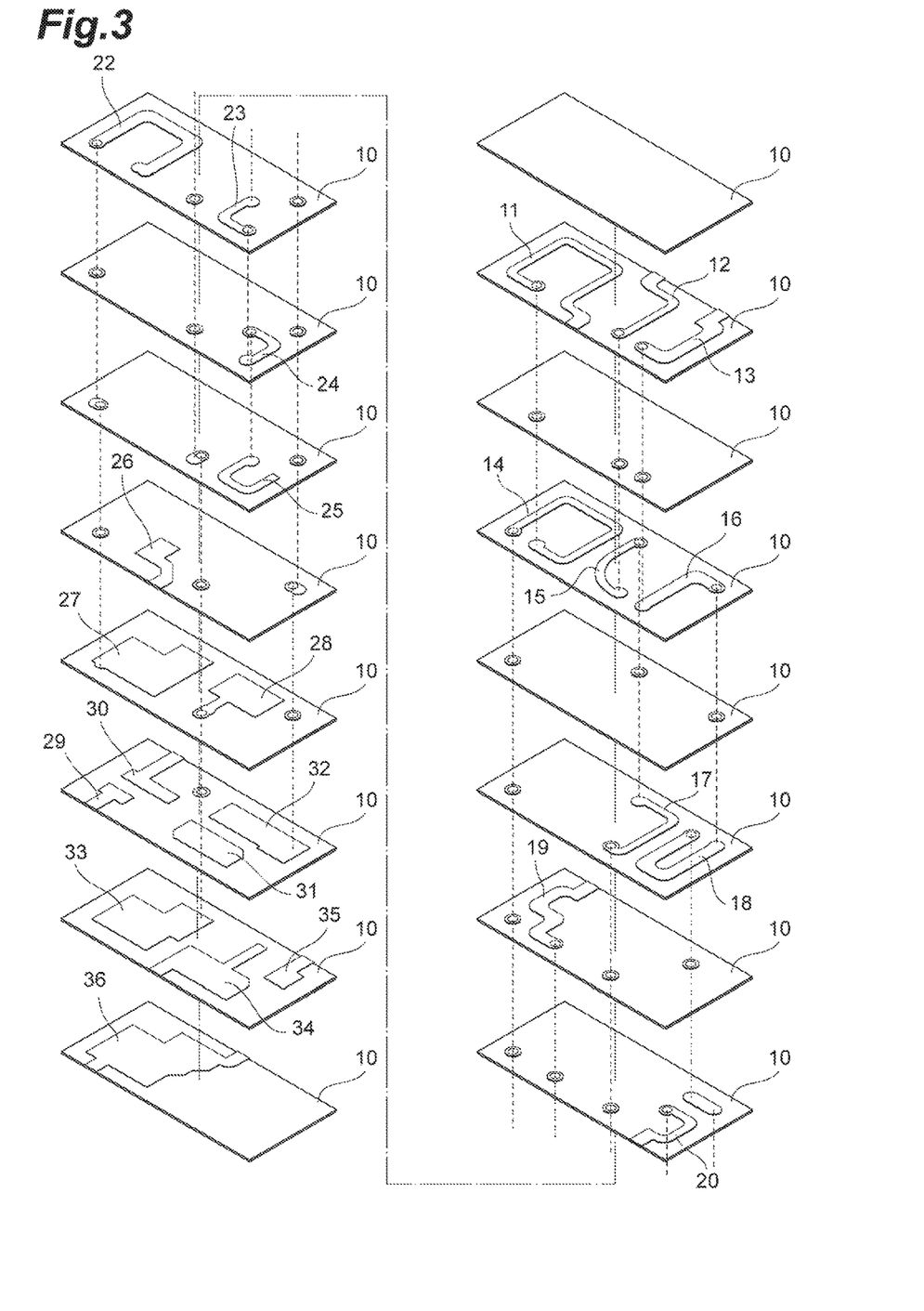
FIG. 3 is an exploded perspective view of an element body.

The element body 2 is configured by stacking a plurality of insulator layers 10 (see FIG. 3). The respective insulator layers 10 are stacked in the direction in which the main surfaces 2c and 2d of the element body 2 face each other. That is, a stacking direction of the insulator layers 10 matches the direction in which the main surfaces 2c and 2d of the element body 2 face each other. Hereinafter, the direction in which the main surfaces 2c and 2d face each other is also referred to as a "stacking direction." Each insulator layer 10 has a substantially rectangular shape. In the actual element body 2, the insulator layers 10 are integrated to such an extent that the boundaries between the layers cannot be visually recognized.

Each insulator layer 10 is configured by, for example, a sintered body of a ceramic green sheet containing a dielectric material (a $BaTiO_3$-based material, a $Ba(Ti, Zr)O_3$-based material, a $(Ba, Ca)TiO_3$-based material, a glass material, an alumina material, or the like). In the actual element body 2, the insulator layers 10 are integrated to such an extent that the boundaries between the layers cannot be visually recognized.

The first terminal electrode 4, the second terminal electrode 5, and the third terminal electrode 6 are arranged on the side surface 2e side of the element body 2. The first terminal electrode 4, the second terminal electrode 5, and the third terminal electrode 6 are formed to cover parts of the side surface 2e in the stacking direction of the element body 2, and are formed in a part of the main surface 2c and a part of the main surface 2d. The first terminal electrode 4 is located on the end surface 2b side, and the third terminal electrode 6 is located on the end surface 2a side. The second terminal electrode 5 is located between the first terminal electrode 4 and the third terminal electrode 6.

The fourth terminal electrode 7, the fifth terminal electrode 8, and the sixth terminal electrode 9 are arranged on the side surface 2f side of the element body 2. The fourth terminal electrode 7, the fifth terminal electrode 8, and the sixth terminal electrode 9 are formed to cover parts of the side surface 2f in the stacking direction of the element body 2, and are formed in a part of the main surface 2c and a part of the main surface 2d. The fourth terminal electrode 7 is located on the end surface 2b side, and the sixth terminal electrode 9 is located on the end surface 2a side. The fifth terminal electrode 8 is located between the fourth terminal electrode 7 and the sixth terminal electrode 9.

Each of the terminal electrodes 4 to 9 includes a conductive material (for example, Ag or Pd). Each of the terminal electrodes 4 to 9 is configured as a sintered body of a conductive paste containing a conductive material (for example, Ag powder or Pd powder). A plating layer is formed on the surface of each of the terminal electrodes 4 to 9. The plating layer is formed, for example, using electroplating. The plating layer has, for example, a layer structure including a Cu plating layer, a Ni plating layer, and a Sn plating layer, or a layer structure including a Ni plating layer and a Sn plating layer.

In this embodiment, the first terminal electrode 4 constitutes the ground terminal G illustrated in FIG. 1. The second terminal electrode 5 constitutes the input terminal $T_{IN}$. The third terminal electrode 6 constitutes the ground terminal G. The fourth terminal electrode 7 constitutes the second output terminal $T_{OUT2}$. The fifth terminal electrode 8 constitutes the ground terminal G. The sixth terminal electrode 9 constitutes the first output terminal $T_{OUT1}$.

The multilayer filter 1 includes the first filter $F_1$, the second filter $F_2$, and the open inductor $L_{OPEN}$ in the element body 2.

As illustrated in FIG. 1, the first filter $F_1$ includes the first LC resonance circuit RC1, and the second LC resonance circuit RC2. The first LC resonance circuit RC1 includes an inductor L1 and three capacitors $C1_1$, $C1_2$, and $C1_3$. The capacitor $C1_2$ and the capacitor $C1_3$ are connected in series. The capacitor $C1_1$ and the capacitors $C1_2$ and $C1_3$ are connected in parallel. The second LC resonance circuit RC2 includes an inductor L2 and a capacitor C2.

Figure 4:
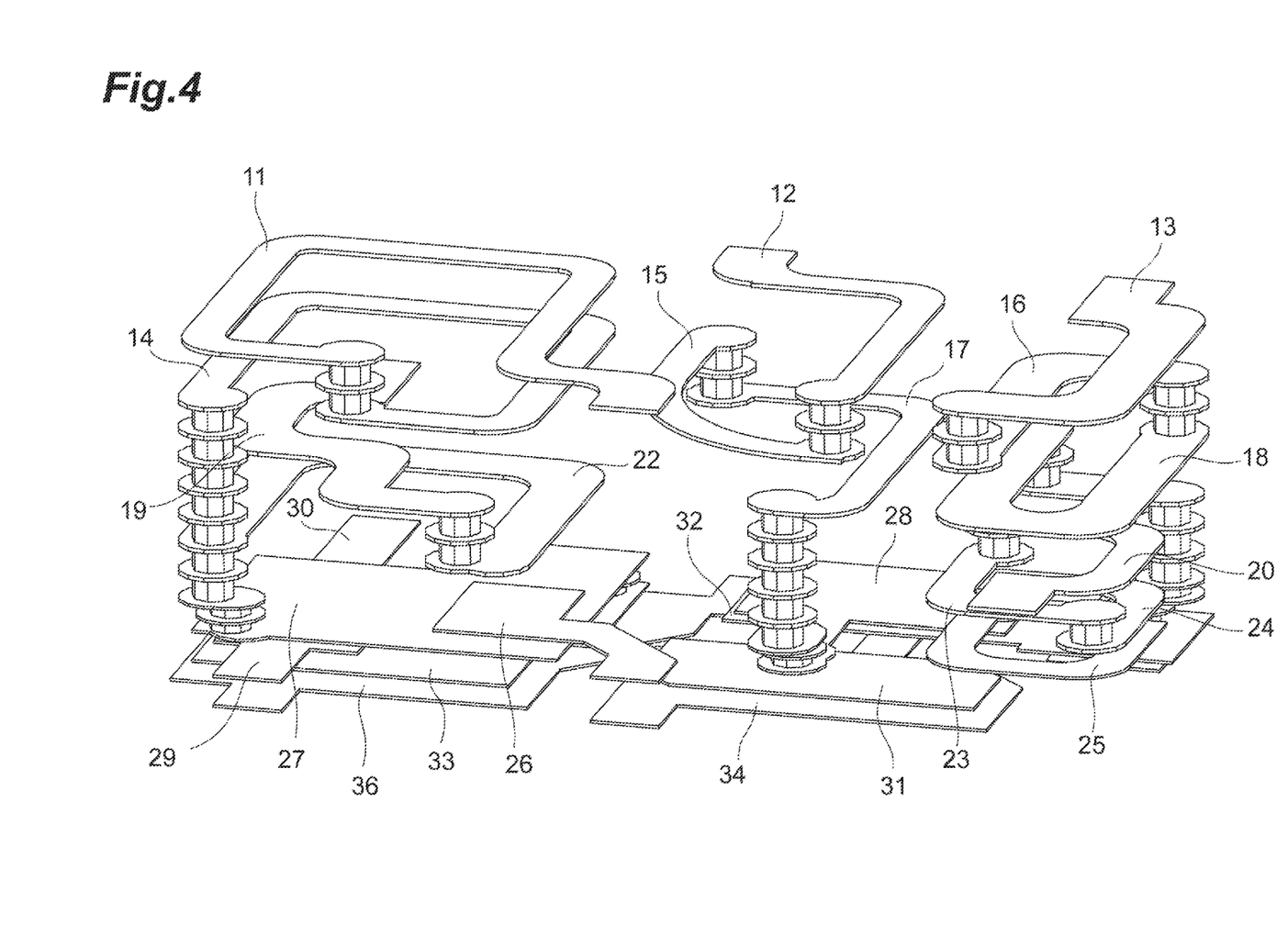
FIG. 4 is a perspective view illustrating a configuration inside the element body.

The inductor L1 includes a coil conductor 12, a coil conductor 15, and a coil conductor 17, as illustrated in FIGS. 3 and 4. The inductor L1 is configured in a loop shape centered on a direction that follows the stacking direction, which is an axial center. One end of the coil conductor 12 is connected to the fifth terminal electrode 8. One end of the coil conductor 17 is electrically connected to an internal electrode 28 and an internal electrode 31 by a through-hole conductor. The coil conductor 12 and the coil conductor 17 include, for example, at least one of Ag and Pd as a conductive material. The coil conductor 12 and the coil conductor 17 are configured as a sintered body of a conductive paste containing at least one of Ag and Pd as a conductive material. In the following description, the coil conductor and the internal electrode are similarly formed.

The capacitor $C1_1$ includes an internal electrode 32 and an internal electrode 34. The internal electrode 34 is connected to the second terminal electrode 5. The capacitor $C1_2$ includes an internal electrode 31 and an internal electrode 34. The capacitor $C1_3$ includes an internal electrode 28 and an internal electrode 32.

The inductor L2 includes a coil conductor 13, a coil conductor 16, and a coil conductor 18. The inductor L2 is configured in a loop shape centered on a direction that follows the stacking direction, which is an axial center. One end of the coil conductor 18 is electrically connected to the internal electrode 32 by a through-hole conductor. The capacitor C2 includes an internal electrode 32 and an internal electrode 35. The internal electrode 35 is connected to the sixth terminal electrode 9.

The second filter $F_2$ includes a third LC resonance circuit RC3, a fourth LC resonance circuit RC4, and a capacitor C. The third LC resonance circuit RC3 includes an inductor L3 and a capacitor C3. The fourth LC resonance circuit RC4 includes an inductor L4 and a capacitor C4.

The inductor L3 includes a coil conductor 11, a coil conductor 14. The inductor L3 is formed in a loop shape centered on a direction that follows the stacking direction, which is an axial center. One end of the coil conductor 11 is connected to the second terminal electrode 5. The capacitor C3 includes an internal electrode 26 and an internal electrode 27. The internal electrode 26 is connected to the second terminal electrode 5. The internal electrode 27 is electrically connected to a coil conductor 22 by a through-hole conductor.

The inductor L4 includes a coil conductor 19 and the coil conductor 22. The inductor L4 is formed in a loop shape centered on a direction that follows the stacking direction, which is an axial center. One end of the coil conductor 22 is electrically connected to one end of the coil conductor 14 by a through-hole conductor. The capacitor C4 includes an internal electrode 30, the internal electrode 27, and an internal electrode 33. The internal electrode 30 is connected to the fourth terminal electrode 7.

The capacitor C includes an internal electrode 29, an internal electrode 36, an internal electrode 27, and an internal electrode 33. The internal electrode 29 is connected to the first terminal electrode 4. The internal electrode 36 is connected to the first terminal electrode 4 and the fifth terminal electrode 8.

The open inductor $L_{OPEN}$ includes a coil conductor 20, a coil conductor 23, a coil conductor 24, and a coil conductor 25. The open inductor $L_{OPEN}$ is configured in a loop shape centered on a direction that follows the stacking direction, which is an axial center. One end of the coil conductor 20 is connected to the third terminal electrode 6. The open inductor $L_{OPEN}$ is arranged at a position facing the inductor L2 of the second LC resonance circuit RC2. That is, the open inductor $L_{OPEN}$ and the inductor L2 are adjacent to each other in the stacking direction. Specifically, the coil conductor 20 of the open inductor $L_{OPEN}$ is arranged at a position at which it faces the coil conductor 18 of the inductor L2 (overlapping when viewed in the stacking direction of the element body 2) with the insulator layer 10 sandwiched therebetween.

Figure 5:
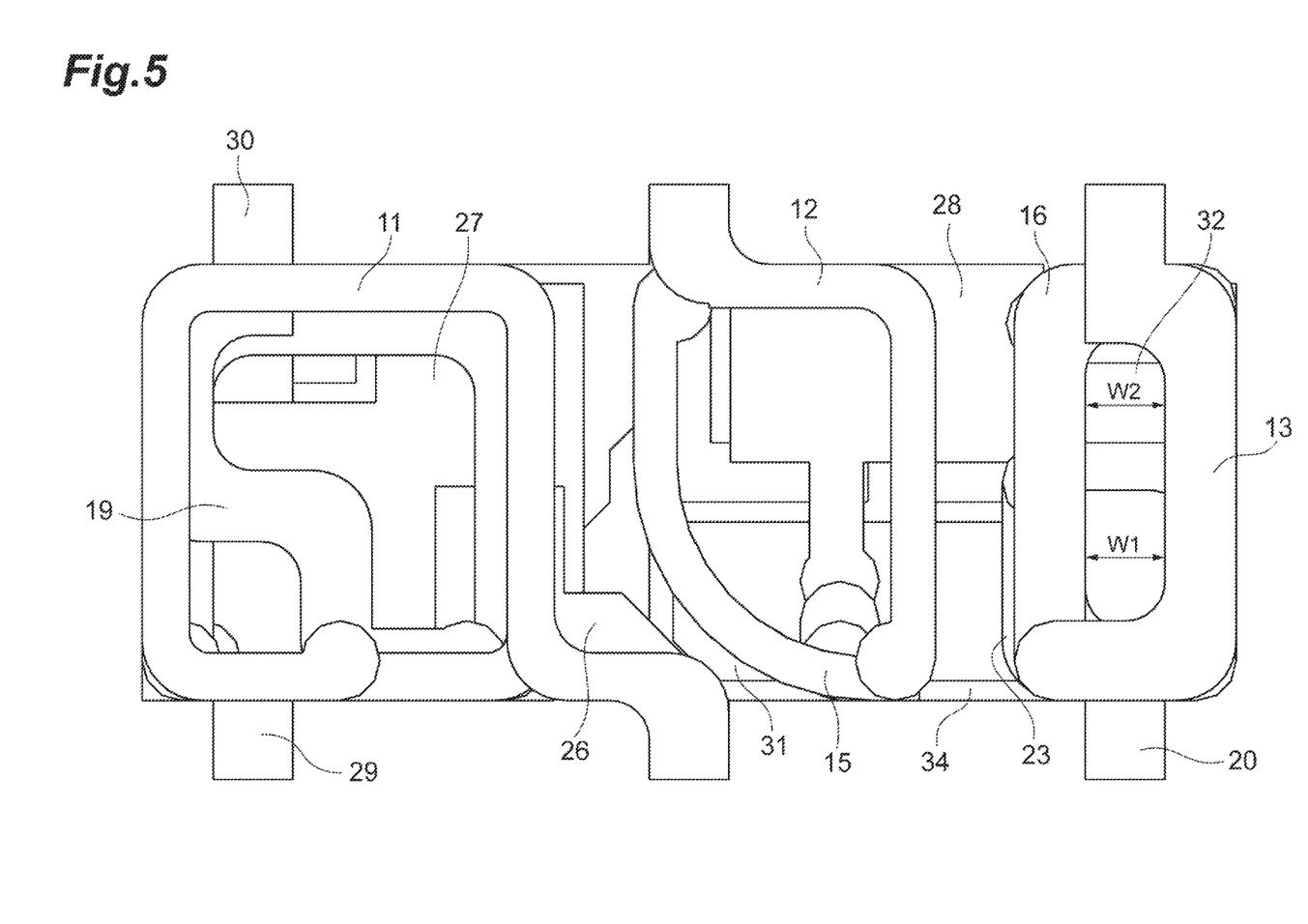
FIG. 5 is a view of the configuration in the element body illustrated in FIG. 4 when viewed from a stacking direction.

As illustrated in FIG. 5, a width W1 on the inner side of the opening inductor $L_{OPEN}$ is the same as a width W2 of the inductor L2 when viewed from a direction that follows an axial center of the open inductor $L_{OPEN}$ and the inductor L2. Specifically, in the facing direction of the pair of end surfaces 2a and 2b in the element body 2, a width W1 that is a distance between inner edges of the coil conductor 20, the coil conductor 23, and the coil conductor 24 constituting the open inductor $L_{OPEN}$ is the same as a width W2 that is a distance between inner edges of the coil conductor 13, the coil conductor 16, and the coil conductor 18 constituting the inductor L2.

Figure 6:
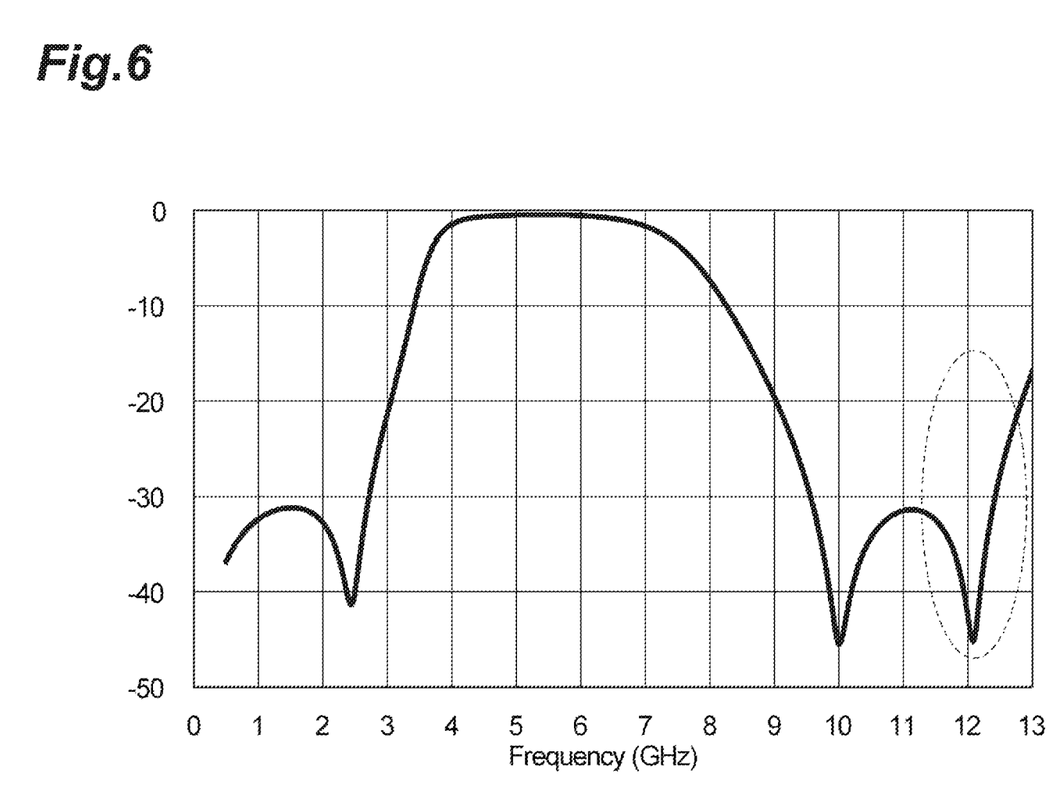
FIG. 6 is a diagram illustrating characteristics of the multilayer filter.

As described above, in the multilayer filter 1 according to this embodiment, the open inductor $L_{OPEN}$ having one end connected to the third terminal electrode 6 (ground terminal) and the other end that is open is provided in the element body 2. The open inductor $L_{OPEN}$ is arranged to face the inductor L2. Thus, a capacitor is formed between the open inductor $L_{OPEN}$ and the inductor L2. Further, the open inductor $L_{OPEN}$ itself has a stray capacitance. Accordingly, in the multilayer filter 1, the same circuit as the LC circuit connected in parallel to the line connecting the second terminal electrode 5 (the input terminal) to the sixth terminal electrode 9 (the first output terminal) is formed. Therefore, in the multilayer filter 1, it is possible to obtain attenuation characteristics that are the same as those when a plurality of LC resonance circuits are provided, as illustrated in a portion surrounded by a broken line in FIG. 6, even when the plurality of LC resonators are not provided. Accordingly, in the multilayer filter 1, it is possible to achieve expansion of the attenuation characteristics while achieving a small size.

In the multilayer filter 1 according to this embodiment, each of the inductors L2 and the open inductor $L_{OPEN}$ is configured in a loop shape centered on a direction that follows the stacking direction, which is an axial center. In the multilayer filter 1, a width W2 on the inner side of the inductor L2 and a width W1 on the inner side of the opening inductor $L_{OPEN}$ are the same when viewed in a direction that follows the axial center. In this configuration, it is possible to suppress hindrance of a flux of the inductor L2 due to the open inductor $L_{OPEN}$. Therefore, since a reduction in a Q value can be suppressed, it is possible to suppress deterioration of characteristics of the multilayer filter 1.

In the multilayer filter 1 according to this embodiment, the first LC resonance circuit RC1 is provided as the first filter $F_1$ in the element body 2. The first LC resonance circuit RC1 is a high pass filter. Thus, when a plurality of filters are configured, a configuration in which the open inductor $L_{OPEN}$ is provided is particularly effective.

The embodiments of the present invention have been described above, but the present invention is not necessarily limited to the above-described embodiments, and various changes can be made without departing from the gist of the invention.

In the above embodiment, the form in which the multilayer filter 1 is a diplexer including the first filter $F_1$ and the second filter $F_2$ has been described by way of example. However, the multilayer filter may be configured to include only the first filter $F_1$. Further, the multilayer filter may be configured to include only the second LC resonance circuit RC2 in the first filter $F_1$.

In the above embodiment, the form in which the capacitor is formed of the open inductor $L_{OPEN}$ and the inductor L2 has been described by way of example. However, the capacitor may be formed of the open inductor $L_{OPEN}$ and the sixth terminal electrode 9. In this case, the open inductor $L_{OPEN}$ and the sixth terminal electrode 9 may be arranged to face each other.

In the above embodiment, the form in which a width W1 on the inner side of the opening inductor $L_{OPEN}$ is the same as a width W2 of the inductor L2 when viewed in a direction that follows the axial center of the open inductor $L_{OPEN}$ and the inductor L2 has been described by way of example.

In the above embodiment, the form in which the respective terminal electrodes 4 to 6 are arranged on the side surface 2e and the main surfaces 2c and 2d, and the respective terminal electrodes 7 to 9 are arranged on the side surface 2f and the main surfaces 2c and 2d has been described by way of example. However, a shape (arrangement form) of the respective terminal electrodes 4 to 9 is not limited thereto.

What is claimed is:

1. A multilayer filter comprising:
an element body formed by stacking a plurality of insulator layers; and
an input terminal, a first output terminal, and a ground terminal arranged on outer surfaces of the element body,
wherein a first LC resonance circuit provided in a line connecting the input terminal to the first output terminal and including a first inductor and a first capacitor, and an open inductor having one end connected to the ground terminal and another end open are provided in the element body,
the open inductor includes a plurality of coil conductors and is formed in a loop shape axially centered on a direction that is parallel to a direction in which the plurality of insulator layers are stacked,
the open inductor is arranged to face the first output terminal or the first inductor,
the one end of the open inductor includes one of the coil conductors arranged in one of the insulator layers and connected to the ground terminal, and
the other end of the open inductor includes another of the coil conductors arranged in another of the insulator layers different from the one of the insulator layers.

2. The multilayer filter according to claim 1, wherein the open inductor and the first inductor are adjacent to each other in the direction in which the plurality of insulator layers are stacked.

3. The multilayer filter according to claim 2,
wherein the first inductor is formed in a loop shape centered on a direction that follows the direction in which the plurality of insulator layers are stacked, which is an axial center, and
a width on the inner side of the first inductor and a width on the inner side of the open inductor are the same, when viewed in a direction that follows the axial center.

4. The multilayer filter according to claim 1,
wherein the first LC resonance circuit selectively passes a first signal at a frequency within a first frequency band among the first signal and a second signal at a frequency within a second frequency band that is a frequency band higher than the first frequency band, and
a second LC resonance circuit is provided in the element body, the second LC resonance circuit being provided in the line connecting the input terminal to the first output terminal, including a second inductor and a second capacitor, and selectively passing the second signal.

5. The multilayer filter according to claim 1,
wherein a second output terminal arranged on one of the outer surfaces of the element body is included, and
a third LC resonance circuit is provided in the element body, the third LC resonance circuit being provided in a line connecting the input terminal to the second output terminal and including a third inductor and a third capacitor.

6. A multilayer filter comprising:
an element body formed by stacking a plurality of insulator layers; and
an input terminal, a first output terminal, and a ground terminal arranged on outer surfaces of the element body,
wherein a first LC resonance circuit provided in a line connecting the input terminal to the first output terminal and including a first inductor and a first capacitor, and an open inductor having one end connected to the ground terminal and another end open are provided in the element body,
the open inductor is arranged to face the first output terminal or the first inductor, and
the open inductor and the first inductor are adjacent to each other in a direction in which the plurality of insulator layers are stacked.

7. A multilayer filter comprising:
an element body formed by stacking a plurality of insulator layers; and
an input terminal, a first output terminal, and a ground terminal arranged on outer surfaces of the element body,
wherein a first LC resonance circuit provided in a line connecting the input terminal to the first output terminal and including a first inductor and a first capacitor, and an open inductor having one end connected to the ground terminal and another end open are provided in the element body,
the open inductor is arranged to face the first output terminal or the first inductor,
the first LC resonance circuit selectively passes a first signal at a frequency within a first frequency band among the first signal and a second signal at a frequency within a second frequency band that is a frequency band higher than the first frequency band, and
a second LC resonance circuit is provided in the element body, the second LC resonance circuit being provided in the line connecting the input terminal to the first output terminal, including a second inductor and a second capacitor, and selectively passing the second signal.

\* \* \* \* \*